US009525122B2

(12) United States Patent
Furukawa et al.

(10) Patent No.: US 9,525,122 B2
(45) Date of Patent: Dec. 20, 2016

(54) POWER GENERATING ELEMENT

(71) Applicant: MITSUMI ELECTRIC CO., LTD., Tokyo (JP)

(72) Inventors: Kenichi Furukawa, Sagamihara (JP); Takayuki Numakunai, Tama (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 160 days.

(21) Appl. No.: 14/410,491

(22) PCT Filed: Jul. 22, 2013

(86) PCT No.: PCT/JP2013/069735
§ 371 (c)(1),
(2) Date: Dec. 22, 2014

(87) PCT Pub. No.: WO2014/017414
PCT Pub. Date: Jan. 30, 2014

(65) Prior Publication Data
US 2015/0325778 A1 Nov. 12, 2015

(30) Foreign Application Priority Data
Jul. 23, 2012 (JP) .................................. 2012-162322

(51) Int. Cl.
*H01L 41/12* (2006.01)
*H02N 2/18* (2006.01)

(52) U.S. Cl.
CPC .............. *H01L 41/125* (2013.01); *H02N 2/18* (2013.01)

(58) Field of Classification Search
CPC .................................. H01L 41/12; H01L 41/06
(Continued)

(56) References Cited

U.S. PATENT DOCUMENTS 5,231,887 A * 8/1993 Arvidsson ............... B60T 13/74
188/163
5,406,153 A * 4/1995 Flatau ...................... H01L 41/12
310/26
(Continued)

FOREIGN PATENT DOCUMENTS

JP          5287796 A      7/1977
JP          09090065       4/1997
(Continued)

OTHER PUBLICATIONS

Japanese Patent Office, International Search Report, PCT/JP2013/069735, Sep. 3, 2013, one page, ISA/Japanese Patent Office, 3-4-3 Kasumigaseki, Chiyoda-ku, Tokyo, Japan.
(Continued)

*Primary Examiner* — Thanh Lam
(74) *Attorney, Agent, or Firm* — Marger Johnson

(57) ABSTRACT

A power generating element includes a magnetostrictive rod through which lines of magnetic force pass in an axial direction thereof, the magnetostrictive rod formed of a magnetostrictive material; a magnetic rod arranged in parallel with the magnetostrictive rod, the magnetic rod formed of a magnetic material; a first coupling mechanism for coupling one end portion of the magnetostrictive rod and one end of the magnetic rod; a second coupling mechanism for coupling the other end portion of the magnetostrictive rod and the other end portion of the magnetic rod; and a coil provided so that the lines of magnetic force pass inside the coil in an axial direction thereof and in which a voltage is generated on the basis of a variation of density of the lines of magnetic force caused when the magnetostrictive rod is expanded or contracted. Further, at least one of the one end portion and the other end portion of the magnetostrictive rod is formed into a male screw portion.

13 Claims, 6 Drawing Sheets

(58) Field of Classification Search
USPC .......................................................... 310/26
See application file for complete search history.

(56) References Cited

U.S. PATENT DOCUMENTS

| | | | |
|---|---|---|---|
| 5,615,172 A | 3/1997 | Kotlyar | |
| 5,705,863 A * | 1/1998 | Teter | H01L 41/12 310/26 |
| 6,246,132 B1 * | 6/2001 | Joshi | H01L 41/12 310/26 |
| 6,294,849 B1 * | 9/2001 | Teter | H01L 41/12 310/26 |
| 6,982,502 B1 * | 1/2006 | Sendaula | H01L 41/12 188/161 |
| 2005/0207600 A1 | 9/2005 | Mori et al. | |

FOREIGN PATENT DOCUMENTS

| | | |
|---|---|---|
| JP | 2005277471 A | 10/2005 |
| JP | 2008072862 | 3/2008 |

OTHER PUBLICATIONS

Office Action issued Apr. 18, 2016 in German Patent Application No. 112013003634.7.

Office Action issued Apr. 8, 2016 in German Patent Application No. 112013003634.7.

* cited by examiner

POWER GENERATING ELEMENT

TECHNICAL FIELD

The present invention relates to a power generating element.

BACKGROUND ART

In recent years, a power generating element which can generate electric power by utilizing a variation of magnetic permeability of a magnetostrictive rod formed of a magnetostrictive material has been developed (for example, see patent document 1).

For example, a power generating unit (power generating element) described in the patent document 1 includes a rod-like super magnetostrictive member (magnetostrictive rod), two permanent magnets respectively attached to both end portions of the super magnetostrictive member and a coil wound around the super magnetostrictive member. When the super magnetostrictive member is deformed (or compressed) in an axial direction thereof or deformed (or bent) in a direction perpendicular to the axial direction thereof, that is, when expansion and contraction occur in the super magnetostrictive member, magnetic permeability of the super magnetostrictive member varies. By utilizing the variation of the magnetic permeability of the super magnetostrictive member, it is possible to vary a magnetic field around the super magnetostrictive member, and thereby generating a voltage in the coil.

Since the power generating unit having such a configuration generates electric power by utilizing the expansion and the contraction of the super magnetostrictive member, strong connecting forces between the super magnetostrictive member and each of the permanent magnets (that is, strong connecting forces between the super magnetostrictive member and other components) are required. In particular, a strong connecting force is especially required when the super magnetostrictive member is expanded. However, it is hard to say that the power generating unit described in the patent document 1 has sufficient connecting forces between these components.

RELATED ART DOCUMENT

Patent Document

Patent document 1: JP H09-90065A

SUMMARY OF THE INVENTION

The present invention has been made in view of the problem mentioned above. Accordingly, it is an object of the present invention to provide a power generating element in which a magnetostrictive rod is reliably fixed to other components and which can efficiently generate electric power.

In order to achieve the object described above, the present invention includes the following features (1) to (13).

(1) A power generating element comprising:

a magnetostrictive rod through which lines of magnetic force pass in an axial direction thereof, the magnetostrictive rod formed of a magnetostrictive material;

a magnetic rod arranged in parallel with the magnetostrictive rod, the magnetic rod formed of a magnetic material;

a first coupling mechanism for coupling one end portion of the magnetostrictive rod and one end portion of the magnetic rod;

a second coupling mechanism for coupling the other end portion of the magnetostrictive rod and the other end portion of the magnetic rod; and a coil provided so that the lines of magnetic force pass inside the coil in an axial direction thereof and in which a voltage is generated on the basis of a variation of density of the lines of magnetic force caused when the magnetostrictive rod is expanded or contracted, wherein at least one of the one end portion and the other end portion of the magnetostrictive rod is formed into a male screw portion.

(2) The power generating element according to the above (1), wherein an effective cross-sectional area of the male screw portion is larger than a cross-sectional area of a portion other than the one end portion and the other end portion of the magnetostrictive rod.

(3) The power generating element according to the above (1) or (2), wherein the magnetostrictive rod has a protruding portion provided on a portion other than the one end portion and the other end portion of the magnetostrictive rod along a circumferential direction thereof.

(4) The power generating element according to the above (3), wherein the protruding portion is provided so as to be movable in the axial direction of the magnetostrictive rod and rotatable around an axis of the magnetostrictive rod.

(5) The power generating element according to any one of the above (1) to (4), wherein the coil is provided around a portion other than the one end portion and the other end portion of the magnetostrictive rod so as to surround the portion of the magnetostrictive rod.

(6) The power generating element according to any one of the above (1) to (5), further comprising:

a magnet for generating the lines of magnetic force, the magnet provided so as to make contact with the one end portion of the magnetostrictive rod; and a connecting portion for connecting the magnet and the one end portion of the magnetic rod, the connecting portion formed of a magnetic material.

(7) The power generating element according to the above (6), wherein the connecting portion is integrally formed with the magnetic rod.

(8) The power generating element according to any one of the above (1) to (7), wherein the one end portion of the magnetostrictive rod is formed into the male screw portion, and wherein the first coupling mechanism includes a first block body in which a female thread portion to be screwed with the male screw portion is formed and a fixation structure for fixing the one end portion of the magnetic rod to the first block body.

(9) The power generating element according to the above (8), wherein the fixation structure includes a screw for fixing the one end portion of the magnetic rod to the first block body and a threaded hole formed in the first block to be screwed with the screw.

(10) The power generating element according to the above (8), wherein the one end portion of the magnetic rod is also formed into a male screw portion, and wherein the fixation structure includes the male screw portion of the magnetic rod and a second female thread portion formed in the first block to be screwed with the male screw portion of the magnetic rod.

(11) The power generating element according to any one of the above (1) to (10), wherein the other end portion of the magnetostrictive rod is formed into the male screw portion, and wherein the second coupling mechanism includes a plate portion which is provided on a side of the other end portion of the magnetic rod, has a through-hole through which the male screw portion can pass and is formed of a magnetic material and a second block body in which a female thread portion to be screwed with the male screw portion passing through the through-hole is formed.

(12) The power generating element according to the above (11), wherein the plate portion is integrally formed with the magnetic rod.

(13) The power generating element according to the above (11), wherein the other end portion of the magnetic rod is also formed into a male screw portion, wherein the plate portion has a second through-hole through which the male screw portion of the magnetic rod can pass, and wherein the power generating element further comprises a third block body in which a female thread portion to be screwed with the male screw portion of the magnetic rod passing through the second through-hole is formed.

Effect of the Invention

According to the present invention, it is possible to reliably fix the magnetostrictive rod to the other components, and thereby efficiently carrying out the expansion and the contraction of the magnetostrictive rod. As a result, it is possible to improve power generating efficiency.

DETAILED DESCRIPTION OF THE PREFERRED EMBODIMENTS

Hereinafter, a power generating element of the present invention will be described in detail with reference to preferred embodiments shown in the accompanying drawings.

First Embodiment

First, description will be given to a power generating element according to a first embodiment of the present invention.

Figure 1:
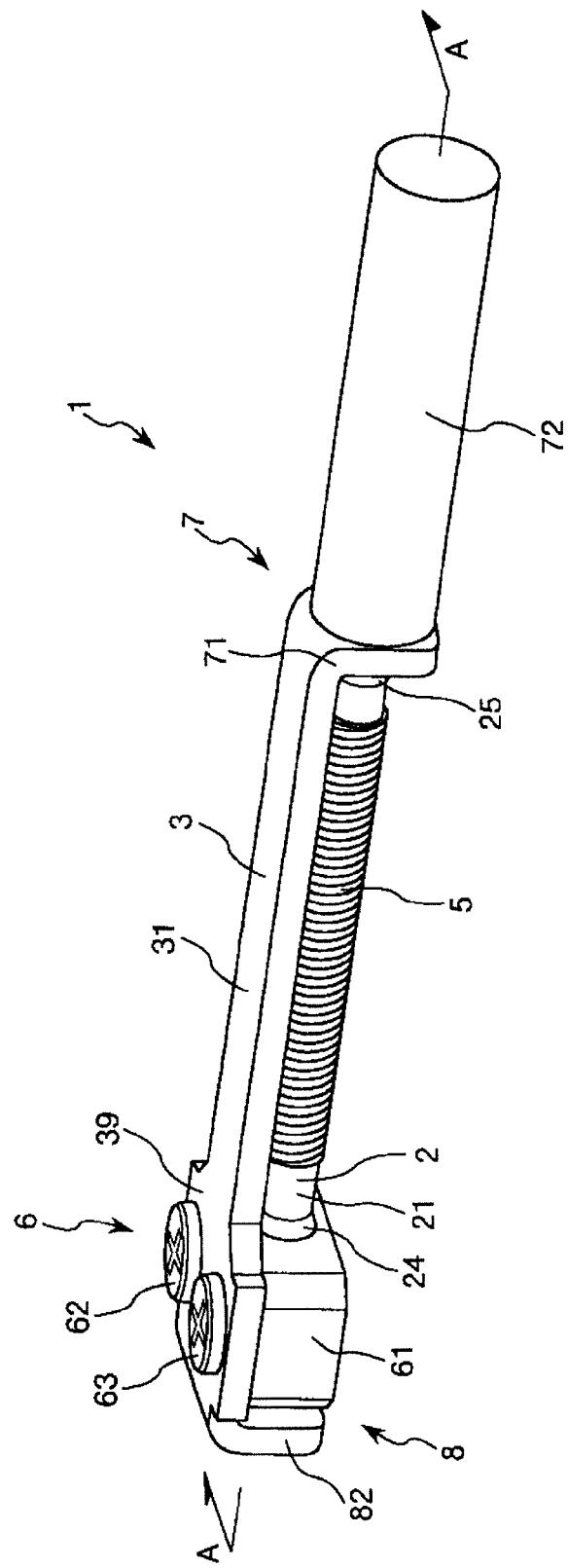
FIG. 1 is a perspective view showing a power generating element according to a first embodiment of the present invention.
Figure 2:
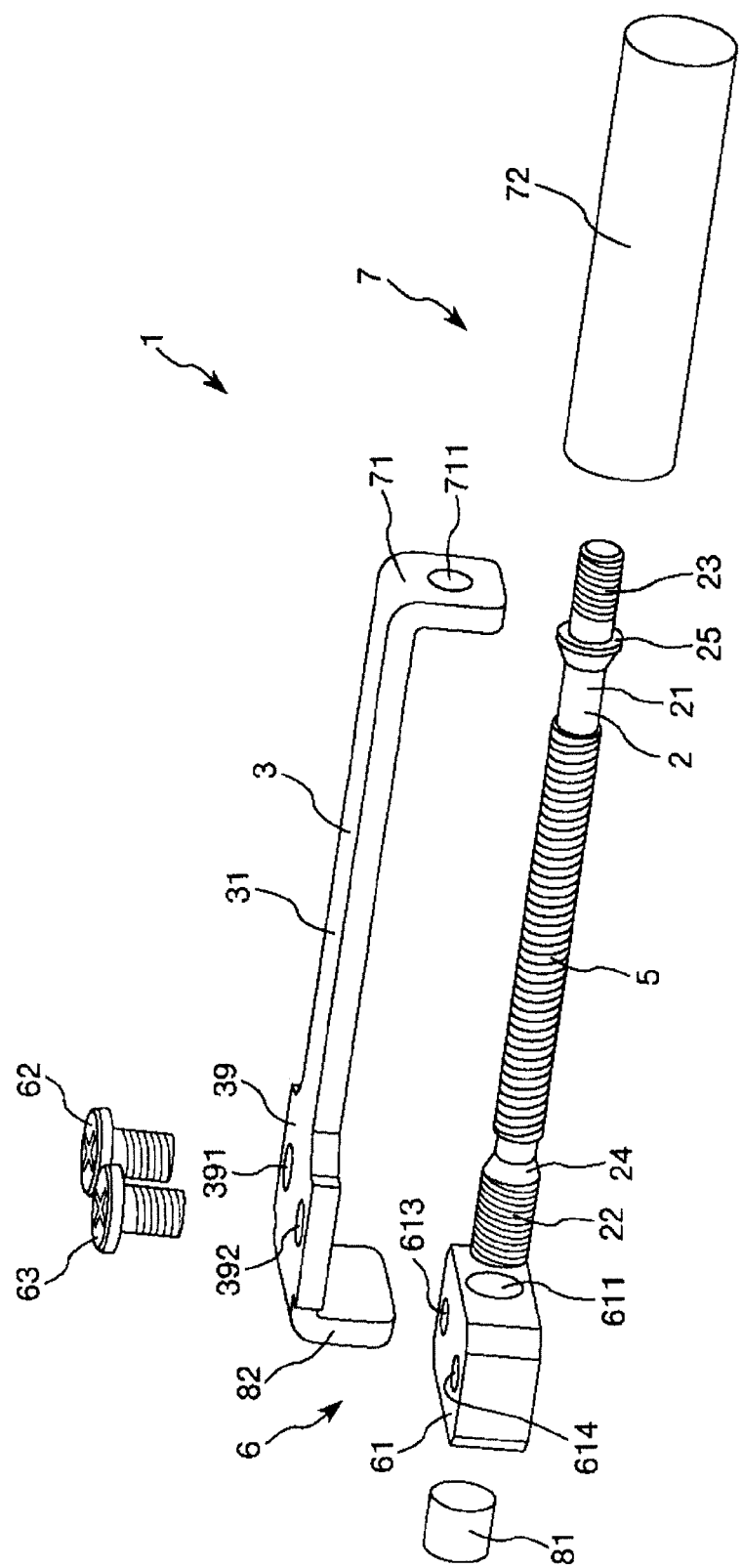
FIG. 2 is an exploded perspective view showing the power generating element shown in FIG. 1.
Figure 3:
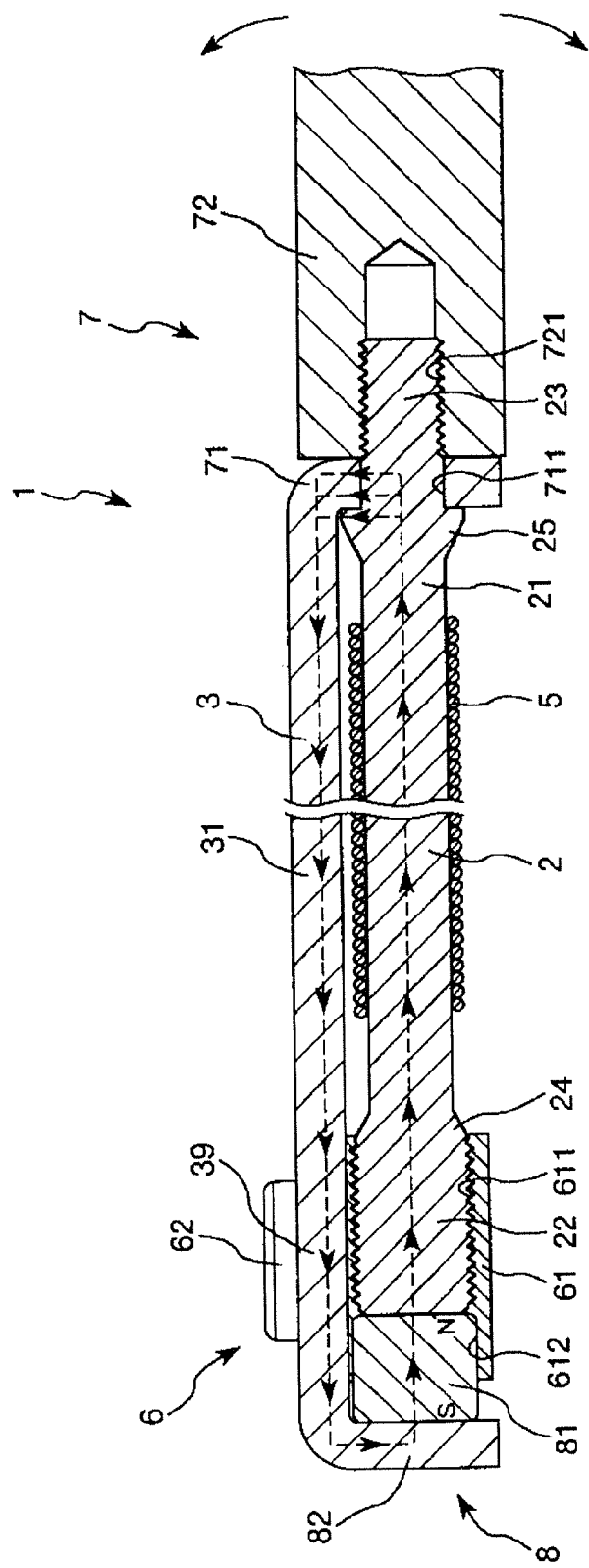
FIG. 3 is a vertical cross-sectional view (taken along an A-A line shown in FIG. 1) showing the power generating element shown in FIG. 1.

FIG. 1 is a perspective view showing the power generating element according to the first embodiment of the present invention. FIG. 2 is an exploded perspective view showing the power generating element shown in FIG. 1. FIG. 3 is a vertical cross-sectional view (taken along an A-A line shown in FIG. 1) showing the power generating element shown in FIG. 1.

Hereinafter, an upper side in each of FIGS. 1 to 3 is referred to as "upper" or "upper side" and a lower side in each of FIGS. 1 to 3 is referred to as "lower" or "lower side". Further, a right side in each of FIGS. 1 to 3 is referred to as "distal side" and a left side in each of FIGS. 1 to 3 is referred to as "proximal side".

A power generating element 1 shown in FIGS. 1 and 2 has a magnetostrictive rod 2 through which lines of magnetic force pass in an axial direction thereof, a magnetic rod 3 arranged in parallel with the magnetostrictive rod 2, a coil 5 provided around the magnetostrictive rod 2, a first coupling mechanism 6 for coupling a proximal end portion (one end portion) of the magnetostrictive rod 2 and a proximal end portion (one end portion) of the magnetic rod 3, a second coupling mechanism 7 for coupling a distal end portion (the other end portion) of the magnetostrictive rod 2 and a distal end portion (the other end portion) of the magnetic rod 3 and a magnetic field applying mechanism 8 for applying a bias magnetic field to the magnetostrictive rod 2.

In the power generating element 1 having such a configuration, the magnetostrictive rod 2 can be expanded and contracted by displacing the distal end portion (other end portion) of the magnetostrictive rod 2 with respect to the proximal end portion (one end portion) of the magnetostrictive rod 2 in a direction substantially perpendicular to the axial direction of the magnetostrictive rod 2. In other words, the magnetostrictive rod 2 can be expanded and contracted by moving the distal end portion with respect to the proximal end portion of the magnetostrictive rod 2 in a vertical direction shown in FIG. 3. At this time, magnetic permeability of the magnetostrictive rod 2 varies due to an inverse magnetostrictive effect. This variation of the magnetic permeability leads to a variation of density of the lines of magnetic force passing through the magnetostrictive rod 2, and thereby generating a voltage in the coil 5.

Hereinafter, description will be given to a configuration of each component of the power generating element 1 of the present invention.

<<Magnetostrictive Rod 2>>

The magnetostrictive rod 2 is formed of a magnetostrictive material and arranged so that a direction in which magnetization is easily generated (an easy magnetization direction) becomes the axial direction thereof. In this embodiment, the magnetostrictive rod 2 has a longitudinal columnar shape and the lines of magnetic force pass through the magnetostrictive rod 2 in the axial direction thereof.

The magnetostrictive rod 2 includes a main body 21, a proximal side male screw portion (sometimes referred to as "one end portion" or "proximal end portion") 22 provided on a proximal side of the main body 21 and a distal side male screw portion (sometimes referred to as "other end portion" or "distal end portion") 23 provided on a distal side of the main body 21. The magnetostrictive rod 2 is coupled with the first coupling mechanism 6 through the proximal side male screw portion 22 and coupled with the second coupling mechanism 7 through the distal side male screw portion 23.

An effective cross-sectional area (effective diameter) of the proximal side male screw portion 22 is set to be larger than a cross-sectional area (diameter) of the main body 21. By setting the effective cross-sectional area of the proximal side male screw portion 22 to satisfy the above relationship, it is possible to improve a connecting force between a first block body 61 of the first coupling mechanism and the proximal side male screw portion 22 where a particularly-large load is applied when the magnetostrictive rod 2 is expanded or contracted. On the other hand, an effective cross-sectional area (effective diameter) of the distal side male screw portion 23 is set to be substantially equal to the cross-sectional area (diameter) of the main body 21.

The magnetostrictive rod 2 further includes a circular flange portion 24 provided on the proximal side of the main body 21 so as to be located between the distal side male screw portion 23 and the proximal side male screw portion 22. The circular flange portion 24 is formed on the main body 21 along a circumferential direction of the main body 21 so as to continue to the proximal side male screw portion 22. A peripheral surface of the flange portion 24 makes a sloping surface along the axial direction of the magnetostrictive rod 2. On the other hand, the magnetostrictive rod 2 further includes a circular flange portion 25 provided on the distal side of the main body 21 so as to be located between the proximal side male screw portion 22 and the distal side male screw portion 23. The circular flange portion 25 is formed on the main body 21 along the circumferential direction of the main body 21. A distal end surface of the flange portion 25 makes a plane substantially perpendicular to the axial direction of the magnetostrictive rod 2 and a peripheral surface of the flange portion 25 makes a sloping surface along the axial direction of the magnetostrictive rod 2.

An average cross-sectional area of the main body 21 is preferably in the range of about 0.2 to 10.0 mm$^2$, and more preferably in the range of about 0.7 to 7.0 mm$^2$. A length of the main body 21 is preferably in the range of about 5 to 40 mm, and more preferably in the range of about 10 to 30 mm.

The effective cross-sectional area of the proximal side male screw portion 22 is preferably equal to or more than 1.5 times as large as the average cross-sectional area of the main body 21, and more preferably equal to about 2.0 times as large as the average cross-sectional area of the main body 21. A length of the proximal side male screw portion 22 is preferably equal to or more than 0.5 times as large as the average cross-sectional area (average diameter) of the main body 21, and more preferably equal to about 2.0 times as large as the average cross-sectional area (average diameter) of the main body 21. By respectively setting these parameters of the proximal side male screw portion 22 to satisfy the above relationships, it is possible to more improve the connecting force between the first block body 61 and the proximal side male screw portion 22.

On the other hand, the effective cross-sectional area of the distal side male screw portion 23 is preferably equal to or more than 1.0 times as large as the average cross-sectional area of the main body 21, and more preferably equal to about 1.5 times as large as the average cross-sectional area of the main body 21. A length of the distal side male screw portion 23 is preferably equal to or more than 0.5 times as large as the average cross-sectional area (average diameter) of the main body 21, and more preferably equal to about 2.0 times as large as the average cross-sectional area (average diameter) of the main body 21. By respectively setting these parameters of the distal side male screw portion 23 to satisfy the above relationships, it is possible to more improve a connecting force between the distal side male screw portion 23 and a second block body 72.

Further, a maximum cross-sectional area of the flange portion 25 is preferably equal to or more than 1.5 times as large as the effective cross-sectional area of the distal side male screw portion 23, and more preferably equal to about 2.0 times as large as the effective cross-sectional area of the distal side male screw portion 23.

A Young's modulus of the magnetostrictive material for the magnetostrictive rod 2 is preferably in the range of about 40 to 100 GPa, more preferably in the range of about 50 to 90 GPa, and even more preferably in the range of about 60 to 80 GPa. By forming the magnetostrictive rod 2 with the magnetostrictive material having the above Young's modulus, it is possible to expand and contract the magnetostrictive rod 2 more drastically. Since this allows the magnetic permeability of the magnetostrictive rod 2 to vary more drastically, it is possible to more improve the power generating efficiency of the power generating element 1 (the coil 5).

The magnetostrictive material having the above Young's modulus is not particularly limited to a specific kind. Examples of such a magnetostrictive material include an iron-gallium based alloy, an iron-cobalt based alloy, an iron-nickel based alloy and a combination of two or more of these materials. Among them, a magnetostrictive material containing an iron-gallium based alloy (having a Young's modulus of about 70 GPa) as a main component thereof is preferably used.

A Young's modulus of the magnetostrictive material containing the iron-gallium based alloy (in particular, an iron-gallium based alloy containing gallium in an amount of 15 to 20 wt %) as the main component thereof is easily adjusted to fall within the above range. Further, since such a magnetostrictive material has moderate ductility, it is easy to form the proximal side male screw portion 22 and the distal side male screw portion 23 with, for example, a cutting processing, a wire discharge processing, a laser processing or the like. Thus, it is possible to reduce a processing cost for the magnetostrictive rod 2.

Further, it is preferred that the magnetostrictive material described above contains at least one of rare-earth metal such as Y, Pr, Sm, Tb, Dy, Ho, Er and Tm. By using the magnetostrictive material containing such a rare-earth metal, it is possible to make the variation of the magnetic permeability of the magnetostrictive rod 2 larger. This magnetostrictive rod 2 is arranged in parallel with the magnetic rod 3.

<<Magnetic Rod 3>>

The magnetic rod 3 is formed of a magnetic material and arranged so that the lines of magnetic force passing through the magnetostrictive rod 2 pass through the magnetic rod 3 in an axial direction thereof. In this embodiment, the magnetic rod 3 has a longitudinal plate-like shape having a substantially constant thickness.

The magnetic rod 3 includes a main body 31 and an enlarged portion (other end portion) 39 provided on a proximal end portion of the main body 31. A width of the enlarged portion 39 is wider than that of the main body 31. The magnetic rod 3 is coupled with the first coupling mechanism 6 through the enlarged portion 39 and coupled with the second coupling mechanism 7 through a distal end portion thereof.

Two through-holes 391, 392 are formed in the enlarged portion 39 so as to pass through the enlarged portion 39 in a thickness direction thereof. Screws 62, 63 (which will be described below) of the first coupling mechanism 6 are respectively inserted into the through-holes 391, 392.

An average thickness of the magnetic rod 3 depends on a constituent material for the magnetic rod 3, but the average thickness is preferably in the range of about 0.5 to 3.0 mm, and more preferably in the range of about 0.8 to 2.0 mm. By setting the average thickness of the magnetic rod 3 to fall within the above range, it is possible to prevent a size of the power generating element 1 from increasing and impart sufficient mechanical strength to the power generating element 1.

Although a Young's modulus of the magnetic material forming the magnetic rod 3 may be different from the Young's modulus of the magnetostrictive material forming the magnetostrictive rod 2, the Young's modulus of the magnetic material forming the magnetic rod 3 is preferably substantially equal to the Young's modulus of the magnetostrictive material. By setting the Young's modulus of the magnetic material forming the magnetic rod 3 to be equal to the Young's modulus of the magnetostrictive material, it is possible to reliably and smoothly displace the magnetostrictive rod 2 in the vertical direction as shown in FIG. 3. In more particular, the Young's modulus of the magnetic material is preferably in the range of about 40 to 100 GPa, more preferably in the range of about 50 to 90 GPa, and even more preferably in the range of 60 to 80 GPa.

The magnetic material having the above Young's modulus is not particularly limited to a specific kind. Examples of such a magnetic material include a pure iron (e.g., "JIS SUY"), a soft iron, a carbon steel, a magnetic steel (silicon steel), a high-speed tool steel, a structural steel (e.g., "JIS SS400"), a stainless permalloy and a combination of two or more of these magnetic materials.

The coil 5 is provided around the main body 21 of the magnetostrictive rod 2 (around the main body 21 of the magnetostrictive rod 2) so as to surround the main body 21.

<<Coil 5>>

The coil 5 is formed by winding a wire around the main body 21. With such a configuration, the coil 5 is provided so that the lines of magnetic force passing through the magnetostrictive rod 2 pass inside the coil 5 (an inner cavity of the coil 5) in an axial direction of the coil 5 (in this embodiment, the axial direction of the coil 5 is equivalent to the axial direction of the magnetostrictive rod 2). On the basis of the variation of the magnetic permeability of the magnetostrictive rod 2, that is, on the basis of the variation of the density of the lines of magnetic force passing through the magnetostrictive rod 2, the voltage is generated in the coil 5.

A type of the wire is not particularly limited to a specific type. Examples of the type of the wire include a wire obtained by covering a copper base line with an insulating layer, a wire obtained by covering a copper base line with an insulating layer to which an adhesive (fusion) function is imparted and a combination of two or more of these wires.

The winding number of the wire is appropriately set depending on a cross-sectional area and the like of the wire. The winding number of the wire is not particularly limited to a specific number, but is preferably in the range of about 100 to 500, and more preferably in the range of about 150 to 450.

Further, the cross-sectional area of the wire is preferably in the range of about $5\times10^{-4}$ to 0.126 mm$^2$, and more preferably in the range of about $2\times10^{-3}$ to 0.03 mm$^2$.

A cross-sectional shape of the wire may be any shape. Examples of the cross-sectional shape of the wire include a polygonal shape such as a triangular shape, a square shape, a rectangular shape and a hexagonal shape; a circular shape and an elliptical shape.

The proximal side male screw portion 22 of the magnetostrictive rod 2 is coupled with the enlarged portion 39 of the magnetic rod 3 through the first coupling mechanism 6.

<<First Coupling Mechanism 6>>

The first coupling mechanism 6 serves as a fixation portion for fixing the power generating element 1 to a case (housing) or the like. When the power generating element 1 is fixed to the case or the like through the first coupling mechanism 6, the power generating element 1 is supported in a cantilevered state that a proximal end portion of the power generating element 1 serves as a fixed end portion and a distal end portion of the power generating element 1 serves as a movable end portion.

In this embodiment, the first coupling mechanism includes the first block body 61 having a rectangular parallelepiped shape and the screws 62, 63. The first block body 61 has a female thread portion 611 formed in a distal end surface of the first block body 61, a magnet receiving portion 612 having an opening and formed in a proximal end surface of the first block body 61 and two threaded holes 613, 614 formed in an upper surface of the first block body 61. The female thread portion 611 is formed so as to be screwed with the proximal side male screw portion 22 of the magnetostrictive rod 2. The threaded holes 613, 614 are formed so as to be respectively screwed with the screws 62, 63. Further, the magnet receiving portion 612 is formed so as to receive a permanent magnet 81 described below.

The female thread portion 611 and the magnet receiving portion 612 are formed in the first block body 61 concentrically (coaxially) with each other along an axial direction of the first block body 61. Further, the female thread portion 611 and the magnet receiving portion 612 are formed so as to be communicated with each other. This configuration can allow a distal end surface of the permanent magnet 81 received in the magnet receiving portion 612 to make contact with a proximal end surface of the proximal side male screw portion 22 screwed into the female thread portion 611 as shown in FIG. 3.

The screws 62, 63 are respectively screwed into the threaded holes 613, 614 through the through-holes 391, 392 formed in the enlarged portion 39 of the magnetic rod 3. Due to the screwing, the magnetic rod 3 is fixed to the first block body 61. Thus, in this embodiment, a fixation structure for fixing the enlarge portion (one end portion) 39 of the magnetic rod 3 to the first block body 61 includes the screws 62, 63 and the threaded holes 613, 614.

Regarding the fixation structure, for example, by forming the threaded holes 613, 614 so as to pass through the first block body 61 in a thickness direction thereof and designing the screws 62, 63 to be longer so that distal portions of the screws 62, 63 protrude from the power generating element 1, it is possible to utilize the distal portions of the screws 62, 63 protruding from the power generating element 1 for fixing the generating element 1 to the case or the like.

As described below, in this embodiment, since the connection between the proximal end portion of the magnetostrictive rod 2 and the proximal end portion of the magnetic rod 3 is achieved by the magnetic field applying mechanism 8, it is possible to form the first block body 61 with a non-magnetic material. The non-magnetic material for the first block body 61 is not particularly limited to a specific kind. Examples of the non-magnetic material include a metallic material, a semiconductor material, a ceramic material, a resin material and a combination of two or more of these materials. In the case of using the resin material as the non-magnetic material for the first block body 61, it is preferred that filler is added into the resin material. Among them, a non-magnetic material containing a metallic material as a main component thereof is preferably used, and a non-magnetic material containing at least one selected from the group consisting of aluminum, magnesium, zinc, copper and an alloy containing at least one of these materials as a main component thereof is more preferably used.

On the other hand, the connection between the distal side male screw portion 23 of the magnetostrictive rod 2 and the distal end portion of the magnetic rod 3 is achieved by the second coupling mechanism 7.

<<Second Coupling Mechanism 7>>

The second coupling mechanism 7 serves as a portion for applying external force or vibration to the magnetostrictive rod 2. When external force toward an upper side or a lower side in FIG. 3 or vibration in the vertical direction in FIG. 3 is applied to the second coupling mechanism 7, the proximal end portion of the magnetostrictive rod 2 becomes a fixed end and the distal end portion of the magnetostrictive rod 2 is reciprocated in the vertical direction. In other words, the distal end portion of the magnetostrictive rod 2 is relatively displaced with respect to the proximal end portion of the magnetostrictive rod 2.

In this embodiment, the second coupling mechanism 7 includes a plate portion 71 continuously provided on the distal end portion of the magnetic rod 3 and the second block body 72 in which a female thread portion 721 is formed. A through-hole 711 is formed in the plate portion 71 so that the distal side male screw portion 23 of the magnetostrictive rod 2 can pass through the through-hole 711. Further, the female thread portion 721 formed in the second block body 72 can be screwed with the distal side male screw portion 23 passing through the through-hole 711.

The plate portion 71 is provided so as to be substantially perpendicular to the axial direction of the magnetic rod 3 and integrally formed with the magnetic rod 3. The through-hole 711 is formed in the plate portion 71 so as to pass through the plate portion 71 in a thickness direction thereof. Thus, an axial direction of the through-hole 711 is substantially parallel to the axial direction of the magnetostrictive rod 2. Further, the second block body 72 has a columnar shape. The female thread portion 721 is formed along an axial direction of the second block body 72 and opens on a proximal end surface of the second block body 72.

With such a configuration, when the distal end portion of the magnetostrictive rod 2 is passed through the through-hole 711 and screwed with the female thread portion 721 of the second block body 72 for assembling the power generating element 1, the distal end surface of the flange portion 25 and the proximal surface of the second block body 72 can make contact with the plate portion 71 from the opposite sides thereof. Further, when the distal side male screw portion 23 is further screwed into the female thread portion 721 to shorten a distance between the flange portion 25 and the second block body 72, a load is applied to the distal side male screw portion 23 so that the distal side male screw portion 23 is expanded (stretched) in the axial direction thereof. In this state, since tensile stress is always applied to the distal side male screw portion 23, the magnetic permeability of the distal side male screw portion 23 increases due to the inverse magnetostrictive effect of the magnetostrictive material. This allows the lines of magnetic force to more efficiently pass through in the power generating element 1.

The plate portion 71 is formed of a magnetic material and integrally formed with the magnetic rod 3. In this embodiment, as shown in FIG. 3, the plate portion 71 is configured to allow the lines of magnetic force passing through the magnetostrictive rod 2 to flow toward the magnetic rod 3 through the plate portion 71. Thus, the second block body 72 may be formed with a magnetic material or the non-magnetic material described above.

The magnetic field applying mechanism 8 for applying the bias magnetic field to the magnetostrictive rod 2 is provided on the proximal side of the magnetostrictive rod 2.

<<Magnetic Field Applying Mechanism 8>>

As shown in FIGS. 2 and 3, the magnetic field applying mechanism 8 includes the permanent magnet 81 and a connecting portion 82 for holding the permanent magnet 81 between the connecting portion 82 and the proximal end surface of the magnetostrictive rod 2. The connecting portion 82 is continuously provided on the proximal end portion of the magnetic rod 3.

The permanent magnet 81 has a discoid shape (columnar shape having a relatively thin thickness). On the other hand, the connecting portion 82 has a plate-like shape and is integrally formed with the magnetic rod 3 so as to be substantially perpendicular to the axial direction of the magnetic rod 3. The permanent magnet 81 received in the magnet receiving portion 612 of the first block body 61 is held by the proximal end surface of the magnetostrictive rod 2 and the connecting portion 82.

With such a configuration, the connection between the permanent magnet 81 and the enlarged portion 39 of the magnetic rod 3 is achieved by the connecting portion 82. As shown in FIG. 3, the permanent magnet 81 is arranged so that its north pole faces to a side of the magnetostrictive rod 2 and its south pole faces to a side of the connecting portion 82. Due to this arrangement, it is possible to form a magnetic field loop circulating in a counterclockwise direction in the power generating element 1.

For example, an alnico magnet, a ferrite magnet, a neodymium magnet, a samarium-cobalt magnet, a magnet (bonded magnet) obtained by molding a composite material prepared by pulverizing and mixing at least one of these magnets with a resin material or a rubber material, or the like may be used as the permanent magnet 81. Further, the connecting portion 82 is formed of a magnetic material and integrally formed with the magnetic rod 3.

In the power generating element 1 having such a configuration, when the second block body 72 is displaced (rotated) toward the lower side in a state that the first block body 61 is fixed to, for example, the case or the like (see FIG. 3), that is, when the distal end portion of the magnetostrictive rod 2 is displaced toward the lower side with respect to the proximal end portion of the magnetostrictive rod 2, the magnetostrictive rod 2 is deformed so as to be contracted in the axial direction thereof. On the other hand, when the second block body 72 is displaced (rotated) toward the upper side, that is, when the distal end portion of the magnetostrictive rod 2 is displaced toward the upper side with respect to the proximal end portion of the magnetostrictive rod 2, the magnetostrictive rod 2 is deformed so as to be expanded in the axial direction thereof. As a result, the magnetic permeability of the magnetostrictive rod 2 varies due to the inverse magnetostrictive effect. This variation of the magnetic permeability of the magnetostrictive rod 2 leads to the variation of the density of the lines of magnetic force (the density of the lines of magnetic force passing through the inner cavity of the coil 5 in the axial direction of the coil 5). As a result, the voltage is generated in the coil 5.

In particular, in this embodiment, the connection between the magnetostrictive rod 2 and the first block body 61 and the connection between the magnetostrictive rod 2 and the second block body 72 are achieved by screwing. Thus, it is possible to keep high connecting forces among them even if the magnetostrictive rod 2 is expanded or contracted. As a result, the power generating element 1 can efficiently generate the electric power.

Further, since the power generating element 1 includes the flange portion 25, it is possible to adjust a penetration depth of the distal side male screw portion 23 with respect to the female thread portion 721 of the second block body 72. As a result, it is possible to keep the state that the tensile stress is always applied to the distal side male screw portion 23, thereby improving the magnetic permeability of the distal side male screw portion 23. This makes it possible to smoothly pass the lines of magnetic force from the magnetostrictive rod 2 toward the magnetic rod 3. Therefore, it is possible to improve the power generating efficiency of the power generating element 1.

Furthermore, it is possible to arrange the permanent magnet 81 coaxially with the magnetostrictive rod 2 so as to make contact with the magnetostrictive rod 2. Thus, it is possible to improve utilization efficiency of the lines of magnetic force which is generated from the permanent magnet 81 and utilized by the power generating element 1. From such a point of view of the utilization efficiency of the lines of magnetic force, the power generating efficiency of the power generating element 1 can be improved.

An amount of the electric power generated by the power generating element 1 is not particularly limited to a specific value, but is preferably in the range of about 100 to 1400 µJ. If the amount of the electric power generated by the power generating element 1 is in the above range, it is possible to efficiently use the power generating element 1 for a wireless switch for house lighting, a home security system or the like (which will be described below) in combination with a wireless communication device.

Second Embodiment

Next, description will be given to a power generating element according to a second embodiment of the present invention.

Figure 4:
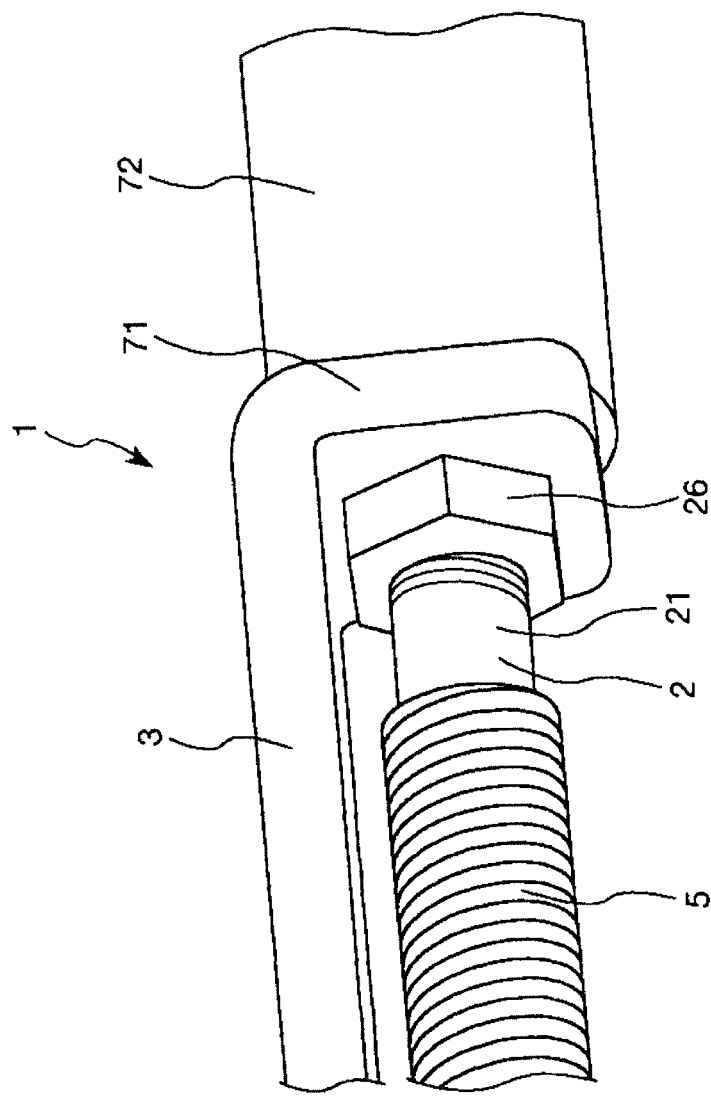
FIG. 4 is an enlarged view showing apart of a distal side of a power generating element according to a second embodiment of the present invention.

FIG. 4 is an enlarged view showing a part of a distal side of the power generating element according to the second embodiment of the present invention. Hereinafter, an upper side in FIG. 4 is referred to as "upper" or "upper side" and a lower side in FIG. 4 is referred to as "lower" or "lower side". Further, a right side in FIG. 4 is referred to as "distal side" and a left side in FIG. 4 is referred to as "proximal side".

Hereinafter, the power generating element according to the second embodiment will be described by placing emphasis on the points differing from the power generating element according to the first embodiment, with the same matters being omitted from description.

A power generating element 1 according to the second embodiment has the same configuration as the power generating element 1 according to the first embodiment except that the protruding portion provided along the circumferential direction of the magnetostrictive rod 2 is modified. Namely, in the power generating element 1 shown in FIG. 4, the protruding portion is formed from a nut 26 instead of the flange portion 25.

A screw thread is formed on one of an inner peripheral surface of the nut 26 and the outer peripheral surface of the magnetostrictive rod 2 and a thread groove is formed on the other one of the inner peripheral surface of the nut 26 and the outer peripheral surface of the magnetostrictive rod 2. This makes it possible to make the nut 26 movable along the axial direction of the magnetostrictive rod 2 and rotatable around an axis of the magnetostrictive rod 2.

With such a configuration, by moving the nut 26 along the axial direction of the magnetostrictive rod 2, it is possible to adjust an expansion amount of the distal side male screw portion 23 of the magnetostrictive rod 2. In this case, since it is unnecessary to form the nut 26 using a magnetic material, it is possible to simplify the configuration of the magnetostrictive rod 2 compared with the magnetostrictive rod 2 according to the first embodiment, and thereby reducing a used amount of the magnetostrictive material which is high-cost. As a result, it is possible to reduce a processing cost for the magnetostrictive rod 2 (manufacturing cost for the power generating element 1).

The power generating element 1 according to the second embodiment can also provide the same functions/effects as the power generating element 1 according to the first embodiment.

Third Embodiment

Next description will be given to a power generating element according to a third embodiment of the present invention.

Figure 5:
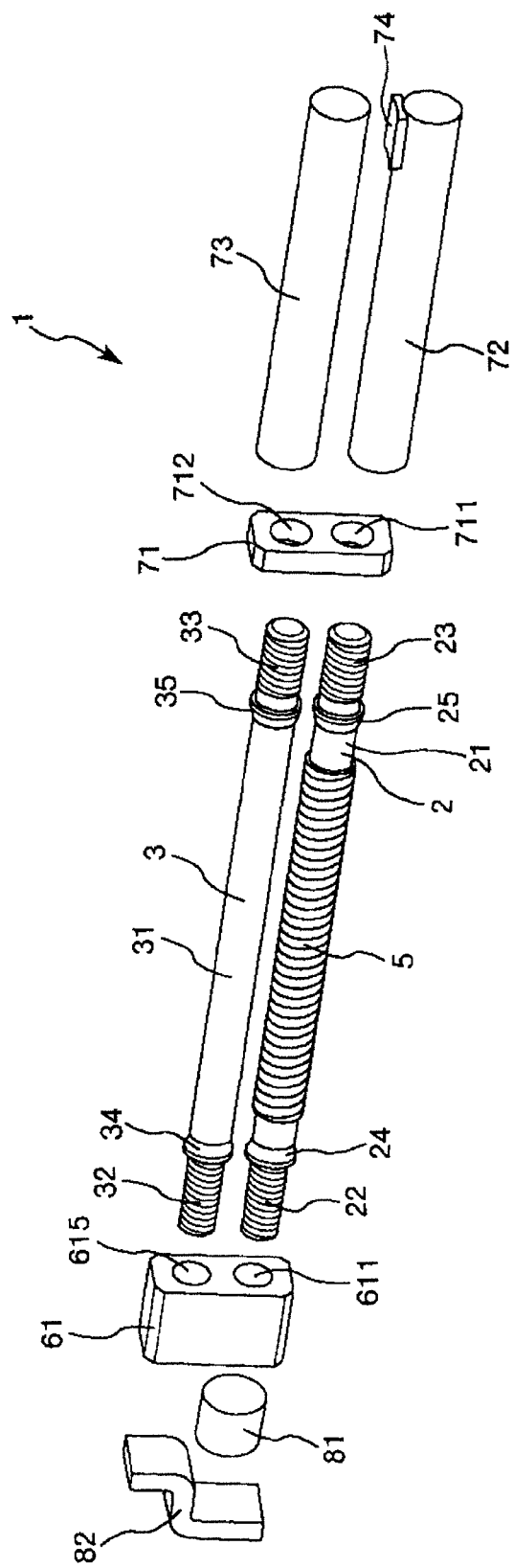
FIG. 5 is an exploded perspective view showing a power generating element according to a third embodiment of the present invention.
Figure 6:
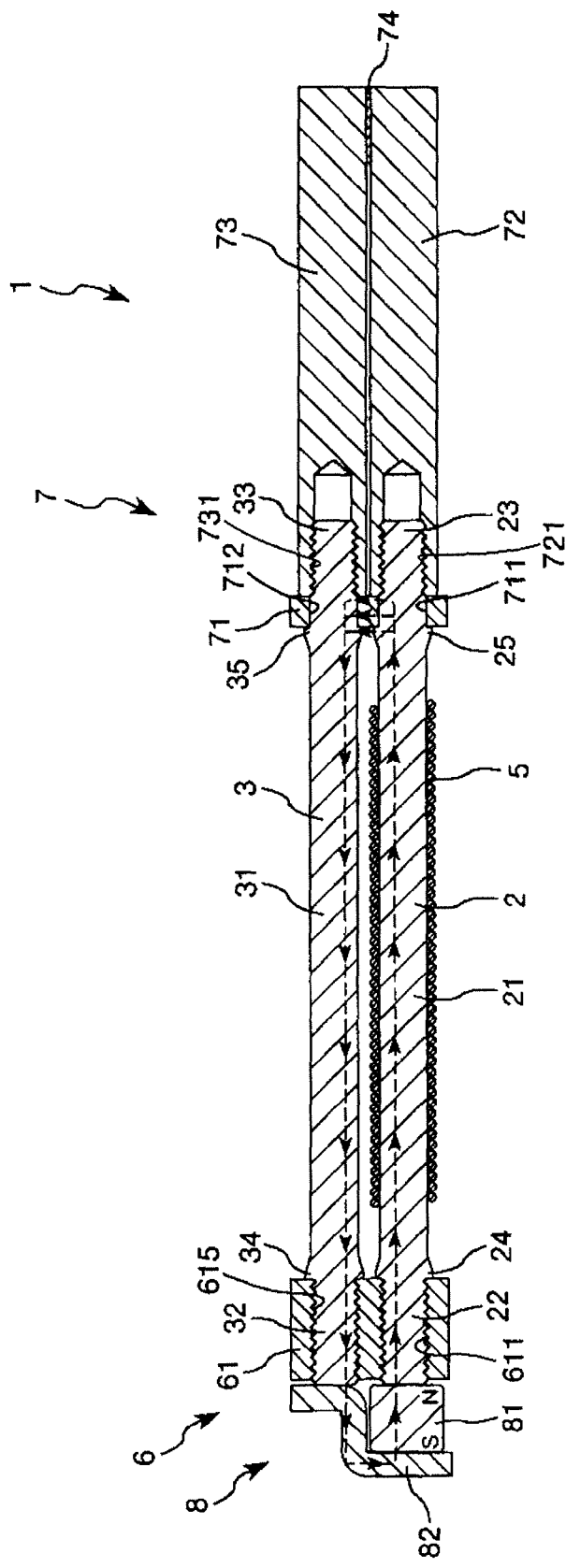
FIG. 6 is a vertical cross-sectional view showing the power generating element shown in FIG. 5.

FIG. 5 is an exploded perspective view showing the power generating element according to the third embodiment of the present invention. FIG. 6 is a vertical cross-sectional view showing the power generating element shown in FIG. 5.

Hereinafter, an upper side in each of FIGS. 5 and 6 is referred to as "upper" or "upper side" and a lower side in each of FIGS. 5 and 6 is referred to as "lower" or "lower side". Further, a right side in each of FIGS. 5 and 6 is referred to as "distal side" and a left side in each of FIGS. 5 and 6 is referred to as "proximal side".

Hereinafter, the power generating element according to the third embodiment will be described by placing emphasis on the points differing from the power generating elements according to the first and the second embodiments, with the same matters being omitted from description.

A power generating element 1 according to the third embodiment has the same configuration as the power generating element 1 according to the first embodiment excepting the following points.

Namely, both the proximal side male screw portion and the distal side male screw portion 23 of the magnetostrictive rod 2 have the same configuration to each other. Further, both the flange portion 24 and the flange portion 25 of the magnetostrictive rod 2 have the same configuration with each other. Furthermore, both an entire configuration of the magnetostrictive rod 2 and an entire configuration of the magnetic rod 3 have the same configuration with each other. Namely, the magnetic rod 3 has a longitudinal columnar shape and includes a main body 31, a proximal side male screw portion (one end portion) 32 provided on the proximal end portion of the main body 31, a distal side male screw portion (the other end portion) 33 provided on the distal end portion of the main body 31 and circular flange portions 34, 35 respectively provided along circumferential directions of the proximal end portion and the distal end portion of the main body 31.

The female thread portion 611 and a second female thread portion 615 which can be respectively screwed with the proximal side male screw portion 22 of the magnetostrictive rod 2 and the proximal side male screw portion 32 of the magnetic rod 3 are formed in the first block body 61 of the first coupling mechanism 6 so as to pass through the first block body 61 in the axial direction of the first block body 61 (a direction from the distal end surface toward the proximal end surface of the first block body 61). Namely, in this embodiment, the fixation structure for fixing the one end portion of the magnetic rod 3 to the first block body 61 includes the proximal side male screw portion 32 of the magnetic rod 3 and the second female thread portion 615 of the first block body 61.

The plate portion 71 of the second coupling mechanism 7 is formed separately from the magnetic rod 3. In addition to the through-hole 711, a second through-hole 712 through which the distal side male screw portion 33 of the magnetic rod 3 can pass is formed in the plate portion 71. Further, in addition to the second block body 72, the power generating element 1 according to this embodiment has a third columnar block body 73 in which a female thread portion 731 to be screwed with the distal side male screw portion 33 of the magnetic rod 3 passing through the second through-hole 712 of the plate portion 71 is formed. The third block body 73 is fixed to the second block body 72 with, for example, an adhesive layer 74 formed of an adhesive agent or the like in a state that the power generating element 1 is assembled.

The connecting portion 82 of the magnetic field applying mechanism 8 is formed separately from the magnetic rod 3 and has a step-like shape like a shape formed by bending a plate. This connecting portion 82 is formed of a magnetic material and provided so as to connect the permanent magnet 81 and the proximal side male screw portion (one end portion) 32 of the magnetic rod 3. In this embodiment, the connecting portion 82 is preferably fixed to the first block body 61 together with the permanent magnet 81 with, for example, a bonding method using an adhesive agent or the like.

The power generating element 1 according to the third embodiment can also provide the same functions/effects as the power generating elements 1 according to the first and the second embodiments.

Further, with the above configuration, it is possible to make the connecting force between the magnetostrictive rod 2 and the first block body 61 and the connecting force between the magnetostrictive rod 2 and the second block body 72 equal to a connecting force between the magnetic rod 3 and the block body 61 and a connecting force between the magnetic rod 3 and the third block body 73, respectively. This makes a contribution to improvement and stabilization of the entire strength of the power generating element 1.

The coil 5 may be provided around the magnetic rod 3 instead of the magnetostrictive rod 2 or provided around both the magnetostrictive rod 2 and the magnetic rod 3. Further, the magnetic rod 3 may be formed of a magnetostrictive material.

The power generating element as described above can be applied to a power supply for a transmitter, a power supply for a sensor network, a wireless switch for house lighting, a system for monitoring status of each component of vehicle (for example, a tire pressure sensor and a sensor for seat belt wearing detection), a home security system (in particular, a system for wirelessly informing detection of operation to a window or a door) or the like.

Although the power generating element of the present invention has been described with reference to the accompanying drawings, the present invention is not limited thereto. In the power generating element, the configuration of each component may be replaced by other arbitrary configurations having equivalent functions. It may also be possible to add other optional components to the present invention. For example, it may also be possible to combine the configurations according to the first embodiment to the third embodiments of the present invention in an appropriate manner.

Further, the power generating element of the present invention can have another configuration in which the permanent magnet is omitted from the power generating element and the power generation of the power generating element may be achieved by utilizing an external magnetic field.

Further, although both the magnetostrictive rod and the magnetic rod have the circular cross-sectional shape in each of the embodiments, the present invention is not limited thereto. Examples of the cross-sectional shapes of the magnetostrictive rod and the magnetic rod include an ellipse shape and a polygonal shape such as a triangular shape, a square shape, a rectangular shape and a hexagonal.

Further, the coil may be formed from a bobbin and a wire wound around the bobbin.

INDUSTRIAL APPLICABILITY

According to the present invention, since the magnetostrictive rod of the power generating element is reliability fixed to the other components, it is possible to efficiently expand and contract the magnetostrictive rod, and thereby improving the power generating efficiency of the power generating element. For the reasons stated above, the present invention is industrially applicable.

DESCRIPTION OF REFERENCE NUMBER

1 . . . power generating element; 2 . . . magnetostrictive rod, 21 . . . main body; 22 . . . proximal side male screw portion; 23 . . . distal side male screw portion; 24, 25 . . . flange portion; 26 . . . nut; 3 . . . magnetic rod; 31 . . . main body; 32 . . . proximal side male screw portion; 33 . . . distal side male screw portion; 34, 35 . . . flange portion; 39 . . . enlarged portion; 391, 392 . . . through-hole; 5 . . . coil; 6 . . . first coupling mechanism; 61 . . . first block body; 611 . . . female thread portion; 612 . . . magnet receiving portion; 613, 614 . . . threaded hole; 615 . . . second female thread portion; 62, 63 . . . screw; 7 . . . second coupling mechanism; 71 . . . plate portion; 711 . . . through-hole; 712 . . . second through-hole; 72 . . . second block body; 721 . . . female thread portion; 73 . . . thirdblock body; 731 . . . female screw portion; 74 . . . adhesive layer; 8 . . . magnetic field applying mechanism; 81 . . . permanent magnet; 82 . . . connecting portion

What is claimed is:

1. A power generating element comprising:
   a magnetostrictive rod through which lines of magnetic force pass in an axial direction thereof, the magnetostrictive rod formed of a magnetostrictive material;
   a magnetic rod arranged in parallel with the magnetostrictive rod, the magnetic rod formed of a magnetic material;
   a first coupling mechanism for coupling one end portion of the magnetostrictive rod and one end portion of the magnetic rod;
   a second coupling mechanism for coupling the other end portion of the magnetostrictive rod and the other end portion of the magnetic rod; and
   a coil provided so that the lines of magnetic force pass inside the coil in an axial direction thereof and in which a voltage is generated on the basis of a variation of density of the lines of magnetic force caused when the magnetostrictive rod is expanded or contracted, wherein at least one of the one end portion and the other end portion of the magnetostrictive rod is formed into a male screw portion.

2. The power generating element as claimed in claim 1, wherein an effective cross-sectional area of the male screw portion is larger than a cross-sectional area of a portion other than the one end portion and the other end portion of the magnetostrictive rod.

3. The power generating element as claimed in claim 1, wherein the magnetostrictive rod has a protruding portion provided on a portion other than the one end portion and the other end portion of the magnetostrictive rod along a circumferential direction thereof.

4. The power generating element as claimed in claim 3, wherein the protruding portion is provided so as to be movable in the axial direction of the magnetostrictive rod and rotatable around an axis of the magnetostrictive rod.

5. The power generating element as claimed in claim 1, wherein the coil is provided around a portion other than the one end portion and the other end portion of the magnetostrictive rod so as to surround the portion of the magnetostrictive rod.

6. The power generating element as claimed in claim 1, further comprising:

a magnet for generating the lines of magnetic force, the magnet provided so as to make contact with the one end portion of the magnetostrictive rod; and a connecting portion for connecting the magnet and the one end portion of the magnetic rod, the connecting portion formed of a magnetic material.

7. The power generating element as claimed in claim 6, wherein the connecting portion is integrally formed with the magnetic rod.

8. The power generating element as claimed in claim 1, wherein the one end portion of the magnetostrictive rod is formed into the male screw portion, and wherein the first coupling mechanism includes a first block body in which a female thread portion to be screwed with the male screw portion is formed and a fixation structure for fixing the one end portion of the magnetic rod to the first block body.

9. The power generating element as claimed in claim 8, wherein the fixation structure includes a screw for fixing the one end portion of the magnetic rod to the first block body and a threaded hole formed in the first block to be screwed with the screw.

10. The power generating element as claimed in claim 8, wherein the one end portion of the magnetic rod is also formed into a male screw portion, and wherein the fixation structure includes the male screw portion of the magnetic rod and a second female thread portion formed in the first block to be screwed with the male screw portion of the magnetic rod.

11. The power generating element as claimed in claim 1, wherein the other end portion of the magnetostrictive rod is formed into the male screw portion, and wherein the second coupling mechanism includes a plate portion which is provided on a side of the other end portion of the magnetic rod, has a through-hole through which the male screw portion can pass and is formed of a magnetic material and a second block body in which a female thread portion to be screwed with the male screw portion passing through the through-hole is formed.

12. The power generating element as claimed in claim 11, wherein the plate portion is integrally formed with the magnetic rod.

13. The power generating element as claimed in claim 11, wherein the other end portion of the magnetic rod is also formed into a male screw portion, wherein the plate portion has a second through-hole through which the male screw portion of the magnetic rod can pass, and wherein the power generating element further comprises a third block body in which a female thread portion to be screwed with the male screw portion of the magnetic rod passing through the second through-hole is formed.

* * * * *

UNITED STATES PATENT AND TRADEMARK OFFICE
CERTIFICATE OF CORRECTION

PATENT NO. : 9,525,122 B2
APPLICATION NO. : 14/410491
DATED : December 20, 2016
INVENTOR(S) : Kenichi Furukawa et al.

Page 1 of 1

It is certified that error appears in the above-identified patent and that said Letters Patent is hereby corrected as shown below:

In the Specification

Column 10, Line 28:
Delete "forma", insert --form a--

Signed and Sealed this
Eighteenth Day of April, 2017

Michelle K. Lee
*Director of the United States Patent and Trademark Office*